United States Patent
Okabe et al.

(10) Patent No.: US 9,159,548 B2
(45) Date of Patent: Oct. 13, 2015

(54) SEMICONDUCTOR PROCESSING SYSTEM INCLUDING VAPORIZER AND METHOD FOR USING SAME

(71) Applicant: TOKYO ELECTRON LIMITED, Minato-ku (JP)

(72) Inventors: Tsuneyuki Okabe, Oshu (JP); Hitoshi Katoh, Oshu (JP); Junya Hiraka, Oshu (JP); Hiroyuki Kikuchi, Oshu (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 47 days.

(21) Appl. No.: 14/088,028

(22) Filed: Nov. 22, 2013

(65) Prior Publication Data

US 2014/0080320 A1 Mar. 20, 2014

Related U.S. Application Data

(62) Division of application No. 12/318,971, filed on Jan. 13, 2009, now abandoned.

(30) Foreign Application Priority Data

Jan. 18, 2008 (JP) .................. 2008-009710

(51) Int. Cl.
| | |
|---|---|
| C23C 16/448 | (2006.01) |
| H01L 21/02 | (2006.01) |
| C23C 16/40 | (2006.01) |
| C23C 16/455 | (2006.01) |
| C23C 16/52 | (2006.01) |

(52) U.S. Cl.
CPC ........ *H01L 21/02186* (2013.01); *C23C 16/409* (2013.01); *C23C 16/448* (2013.01); *C23C 16/4486* (2013.01); *C23C 16/45531* (2013.01); *C23C 16/52* (2013.01)

(58) Field of Classification Search
CPC ................ C23C 16/409; C23C 16/448; C23C 16/4486; C23C 16/52; C23C 16/45531
See application file for complete search history.

(56) References Cited

U.S. PATENT DOCUMENTS

| | | |
|---|---|---|
| 8,197,600 B2 | 6/2012 | Nakao et al. |
| 2005/0045099 A1 | 3/2005 | Bencher et al. |

(Continued)

FOREIGN PATENT DOCUMENTS

| | | |
|---|---|---|
| JP | 11-193463 | 7/1999 |
| JP | 2002-324794 | 11/2002 |

(Continued)

OTHER PUBLICATIONS

Machine translation of JP 2002-324794, Yamawaki et al. Vapor Growth Method and Vapor Growth System, Nov. 2002.

*Primary Examiner* — Queenie Dehghan
(74) *Attorney, Agent, or Firm* — Oblon, McClelland, Maier & Neustadt, L.L.P.

(57) ABSTRACT

A method for using a system, which includes a film formation apparatus for forming a high-dielectric constant thin film on target substrates together and a gas supply apparatus for supplying a process gas. The method includes a preparatory stage of determining a set pressure range of pressure inside a vaporizing chamber for a liquid material cooled at a set temperature. The preparatory stage includes obtaining a first limit value of pressure at which vaporization of the liquid material starts being inhibited due to an increase in the pressure, obtaining a second limit value of pressure at which vaporization of the liquid material starts being unstable and the pressure starts pulsating movement due to a decrease in the pressure, and determining the set pressure range to be defined by an upper limit lower than the first limit value and a lower limit higher than the second limit value.

9 Claims, 5 Drawing Sheets

(56) References Cited

U.S. PATENT DOCUMENTS

2006/0275948 A1    12/2006  Takamatsu et al.
2007/0079760 A1*   4/2007   Okabe et al. .................. 118/715

FOREIGN PATENT DOCUMENTS

| | | |
|---|---|---|
| JP | 2003-160869 | 6/2003 |
| WO | 01/36702 A1 | 5/2001 |

* cited by examiner

SEMICONDUCTOR PROCESSING SYSTEM INCLUDING VAPORIZER AND METHOD FOR USING SAME

CROSS-REFERENCE TO RELATED APPLICATIONS

The present divisional application is a divisional of U.S. application Ser. No. 12/318,971, filed on Jan. 13, 2009, the entire contents of which is incorporated herein by reference, and which is based upon and claims the benefit of priority under 35 U.S.C. §119 from prior Japanese Application No. 2008-009710, filed on Jan. 18, 2008.

BACKGROUND OF THE INVENTION

1. Field of the Invention

The present invention relates to a semiconductor processing system including a vaporizer for generating a process gas from a liquid material, and particularly to a system comprising a film formation processing apparatus for performing, e.g., ALD (Atomic Layer Deposition), MLD (Molecule Layer Deposition), or low pressure CVD (Chemical Vapor Deposition). The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

A film formation process for forming a predetermined film on the surface of a semiconductor wafer is performed in manufacturing semiconductor devices. For example, a process of this kind is performed, using a low-pressure CVD apparatus. In low-pressure CVD apparatuses, a source material is supplied in a gaseous state to promote a chemical reaction, thereby depositing a thin film on the surface of a wafer. In apparatuses of this kind, there is a case where a process gas is generated by vaporizing a liquid material, and is supplied into a process chamber as a film formation gas. For example, in order to vaporize a liquid material, there is known a structure including a carrier gas supply passage formed concentrically around a liquid material supply passage. These supply passages are connected to a nozzle at their lower ends, from which a liquid material and a carrier gas are delivered to atomize the liquid material into mist by means of a nebulizer action. Then, the atomized liquid material is heated and thereby vaporized.

In a nozzle of this spray type, the pressure inside the vaporizing chamber needs to be lower than a pressure limit value for vaporizing the liquid material, and thus, conventionally, the pressure inside the vaporizing chamber is preferably set to be as low as possible. On the other hand, recently, since semiconductor devices need to use high-dielectric constant thin films, studies have been made on vaporization of a liquid material comprising a solid material, such as $Sr(THD)_2$ (strontium bistetramethyl-heptanedionato) or $Ti(MPD)(THD)_2$ (titanium methylpentanedionatobistetramethylheptanedionato), or a high viscosity liquid source, such as $Sr(METHD)_2$ (strontium bismethoxyethoxytetramethylheptanedionato), dissolved in a solvent. Where a liquid material of this kind is vaporized, if the flow rate of the liquid material is too small, the pressure inside the vaporizing chamber becomes too low, and the solvent or thinner may be preferentially boiled in the tip of the nozzle. In this case, the solute of the liquid material is precipitated in the tip of the nozzle and causes nozzle clogging and/or spray abnormality. Consequently, residues are increased due to a deterioration of the vaporizing efficiency, and case particle contamination on wafers.

Conventionally, semiconductor processing systems including a gas supply apparatus using a vaporizer of this kind are arranged such that the structure and use conditions of the gas supply apparatus are preset in accordance with a liquid material, and the pressure of the vaporizer is not controlled independently of the semiconductor processing apparatus. However, in order to prevent problems from being caused by the new liquid materials described above, there has been proposed a structure that includes a pressure sensor for monitoring the pressure inside the vaporizing chamber (Jpn. Pat. Appln. KOKAI Publication No. 2002-324794 (Patent Document 1: page 5, paragraph 2, and FIG. 1)). According to the invention disclosed in Patent Document 1, the pressure inside the vaporizing chamber is monitored by the pressure sensor, so that, when a decrease in the pressure inside the vaporizing chamber is detected due to progress of clogging in the tip of the nozzle, the liquid material is stopped to interrupt the film formation process. Then, a solvent that has a vaporizing temperature higher than the solvent of the liquid material is supplied into the feed line to stop drying of the interior of the feed line and to clean the interior of the feed line by dissolving an organic metal derived from the liquid material and precipitated due to a decrease in the pressure inside the vaporizing chamber. Consequently, the tip of the feed line can be prevented from being completely clogged, so as to eliminate a working operation time of about two days for replacing the feed line, thereby improving the productivity.

However, according to the invention disclosed in Patent Document 1, when a decrease in the pressure inside the vaporizing chamber is detected during a film formation process, the substrate being treated by the film formation process is suspended halfway. Then, this substrate is discarded, because this substrate may be contaminated with particles of e.g., the organic metal precipitated due to a decrease in the pressure inside the vaporizing chamber. Accordingly, the invention disclosed in Patent Document 1 can safely stop the apparatus to prevent the feed line from being completely clogged when the pressure inside the vaporizing chamber is lowered, but needs to discard the substrate being treated by the film formation process and to reset the process with a new substrate.

BRIEF SUMMARY OF THE INVENTION

An object of the present invention is to provide a semiconductor processing system including a vaporizer for generating a process gas from a liquid material, and a method for using the system, which can prevent nozzle clogging of the vaporizer, thereby stably performing a semiconductor process, such as a film formation process, without stopping the semiconductor process.

According to a first aspect of the present invention, there is provided a semiconductor processing system comprising a semiconductor processing apparatus and a gas supply apparatus for supplying a process gas into the semiconductor processing apparatus, the semiconductor processing apparatus comprising: a process chamber configured to accommodate a target substrate; a support member configured to support the target substrate inside the process chamber; a heater configured to heat the target substrate inside the process chamber; and an exhaust mechanism configured to exhaust gas from inside the process chamber, and the gas supply apparatus comprising: a container that forms a vaporizing chamber configured to vaporize a liquid material; a nozzle configured to atomize the liquid material by a carrier gas and to supply the liquid material into the vaporizing chamber; a liquid material supply passage configured to supply the liquid material to the nozzle; a carrier gas supply passage configured to supply the carrier gas to the nozzle; a heater configured to heat an interior of the vaporizing chamber to vaporize the liquid material thus atomized and thereby to generate the process gas; a gas supply passage configured to supply the process gas from the vaporizing chamber to the process chamber; a pressure detector configured to detect pressure inside the vaporizing chamber; a pressure adjusting mechanism configured to adjust the pressure inside the vaporizing chamber; and a control section configured to control an operation of the pressure adjusting mechanism, wherein the control section is preset control an operation of the pressure adjusting mechanism to cause the pressure inside the vaporizing chamber to fall within a predetermined pressure range with reference to a pressure detection value obtained by the pressure detector, and the predetermined pressure range is defined by an upper limit lower than a first limit value, at which vaporization of the liquid material starts being inhibited due to an increase in the pressure, and a lower limit higher than a second limit value, at which vaporization of the liquid material starts being unstable and the pressure inside the vaporizing chamber starts pulsating movement due to a decrease in the pressure.

According to a second aspect of the present invention, there is provided a method for using a semiconductor processing system comprising a semiconductor processing apparatus and a gas supply apparatus for supplying a process gas into the semiconductor processing apparatus, the semiconductor processing apparatus comprising: a process chamber configured to accommodate a target substrate; a support member configured to support the target substrate inside the process chamber; a heater configured to heat the target substrate inside the process chamber; and an exhaust mechanism configured to exhaust gas from inside the process chamber, the gas supply apparatus comprising: a container that forms a vaporizing chamber configured to vaporize a liquid material; a nozzle configured to atomize the liquid material by a carrier gas and to supply the liquid material into the vaporizing chamber; a liquid material supply passage configured to supply the liquid material to the nozzle; a carrier gas supply passage configured to supply the carrier gas to the nozzle; a heater configured to heat an interior of the vaporizing chamber to vaporize the liquid material thus atomized and thereby to generate the process gas; a gas supply passage configured to supply the process gas from the vaporizing chamber to the process chamber; a pressure detector configured to detect pressure inside the vaporizing chamber; and a pressure adjusting mechanism configured to adjust the pressure inside the vaporizing chamber, and the method comprising: obtaining a first limit value at which vaporization of the liquid material starts being inhibited due to an increase in the pressure inside the vaporizing chamber; obtaining a second limit value at which vaporization of the liquid material starts being unstable and the pressure inside the vaporizing chamber starts pulsating movement due to a decrease in the pressure; determining a predetermined pressure range defined by an upper limit lower than the first limit value and a lower limit higher than the second limit value; and controlling an operation of the pressure adjusting mechanism to cause the pressure inside the vaporizing chamber to fall within the predetermined pressure range with reference to a pressure detection value obtained by the pressure detector.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
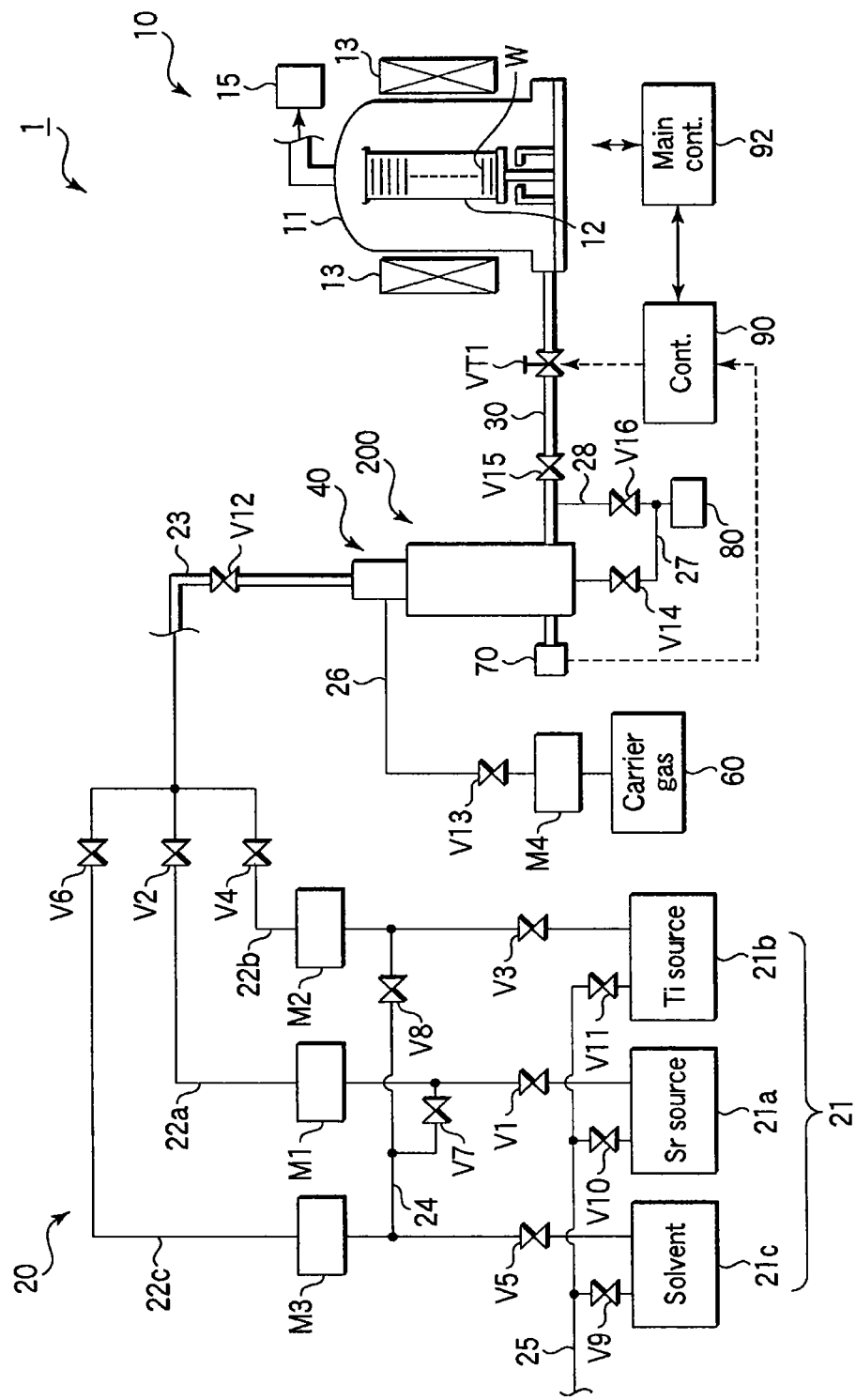
FIG. 1 is a structural view schematically showing a semiconductor processing system (film formation system) according to a first embodiment of the present invention, which includes a semiconductor processing apparatus and a gas supply apparatus.

Embodiments of the present invention will now be described with reference to the accompanying drawings. In the following description, the constituent elements having substantially the same function and arrangement are denoted by the same reference numerals, and a repetitive description will be made only when necessary.

First Embodiment

Figure 2:
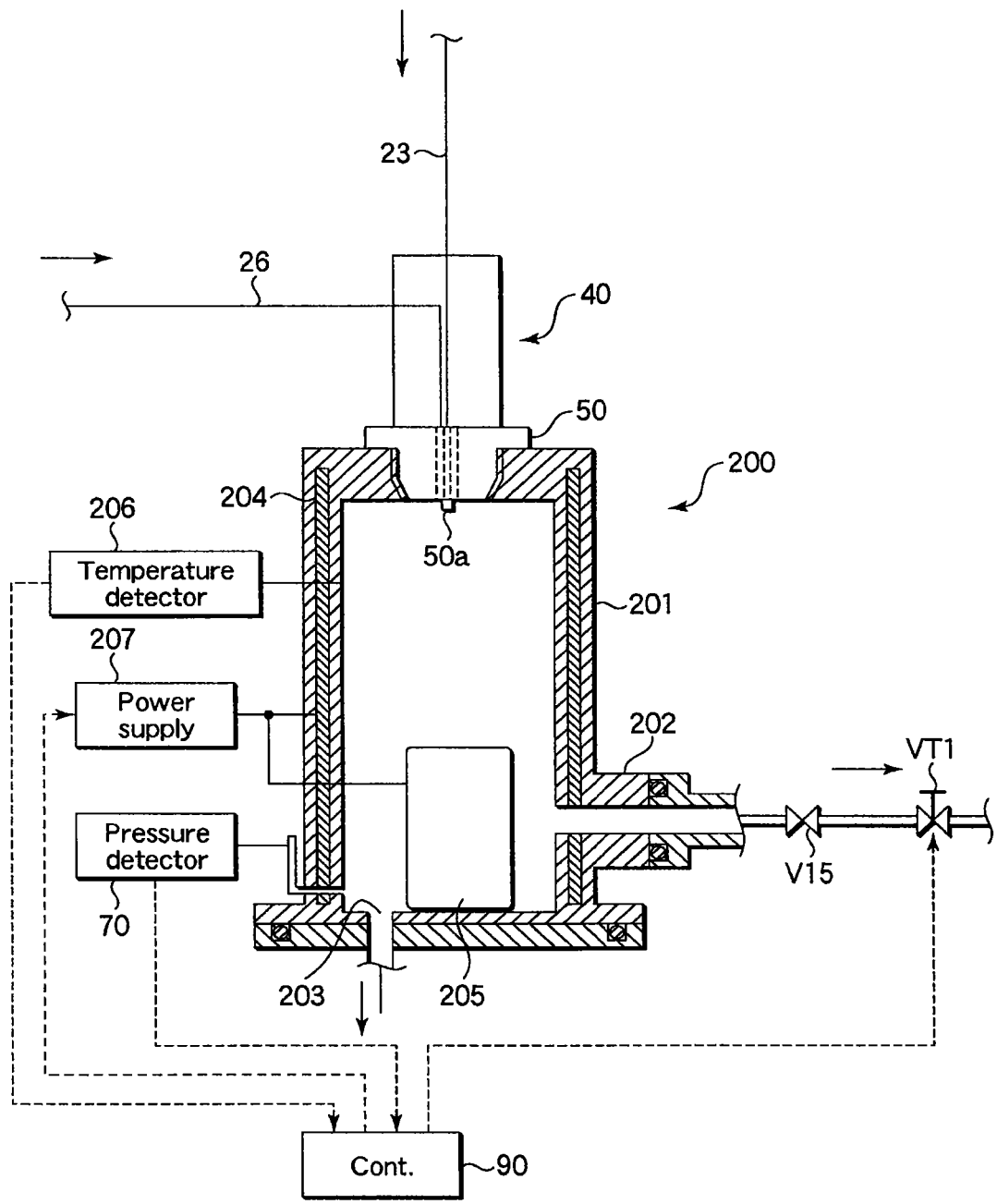
FIG. 2 is a sectional side view showing a vaporizer used in the gas supply apparatus of the system shown in FIG. 1.

FIG. 1 is a structural view schematically showing a semiconductor processing system (film formation system) according to a first embodiment of the present invention. FIG. 2 is a sectional side view showing a vaporizer used in the gas supply apparatus of the system shown in FIG. 1. As shown in FIG. 1, the film formation system 1 according to this embodiment includes a film formation processing apparatus (semiconductor processing apparatus) 10 for performing a predetermined film formation process on target substrates, such as semiconductor wafers (which may be simply referred to as wafers), and a gas supply apparatus 20 for supplying a predetermined process gas into the film formation processing apparatus 10.

For example, the film formation section 10 comprises a low-pressure CVD apparatus of the batch type having a vertical reaction tube 11 used as a reaction chamber (process chamber). A wafer boat 12 that can support a number of wafers W is loaded and unloaded into and from the reaction tube 11. A heater 13 is disposed around the reaction tube 11 to heat the wafers W. A vacuum pump 15 used as vacuum exhaust means is disposed to maintain the interior of the reaction tube 11 at a predetermined vacuum level. A process gas supply line 30 is connected to the reaction tube 11 to supply a predetermined process gas, as described later, to perform a predetermined film formation process on the wafers.

The gas supply apparatus 20 includes a storage section 21 that stores liquid materials and a solvent used for the liquid materials, a vaporizer 200 for vaporizing a liquid material supplied from the storage section 21, and piping lines connecting these members.

The storage section 21 includes a first storage vessel 21a and a second storage vessel 21b that store different liquid materials and a third storage vessel 21c that stores a solvent used for the liquid materials. The liquid material stored in the first storage vessel 21a is formed of, e.g., a solid material of $Sr(THD)_2$ dissolved in THF (Tetrahydrofuran) serving as a solvent. The liquid material stored in the second storage vessel 21b is formed of, e.g., $Ti(MPD)(THD)_2$ dissolved in the solvent. These liquid materials are alternately vaporized and supplied to perform a film formation process according to this embodiment. However, these liquid materials may be mixed and supplied to perform a film formation process. Alternatively, these liquid materials may be separately supplied to perform different processes.

A collecting line 23 is connected to the first storage vessel 21a through a first source material supply line 22a, to the second storage vessel 21b through a second source material supply line 22b, and to the third storage vessel 21c through a solvent supply line 22c. Each of the liquid materials is supplied through the collecting line 23 and a valve V12 into the vaporizer 200. The solvent can be supplied into the vaporizer 200 to perform cleaning. These supply lines 22a, 22b, and 22c are provided with valves V1 to V6 and flow rate regulators M1 to M3.

The solvent supply line 22c is connected to the first and second source material supply lines 22a and 22b through connection lines 24 respectively provided with valves V7 and V8. The supply lines 22a, 22b, and 22c may be provided with a temperature adjusting mechanism that surrounds the lines to set the liquid materials and solvent at a constant temperature, such as about 40° C. A pressurized gas supply line 25 is connected to the first storage vessel 21a, second storage vessel 21b, and third storage vessel 21c through valves V9 to V11, respectively. The other end of the pressurized gas supply line 25 is connected to a pressurized gas supply source (not shown) for supplying a pressurized gas, such as helium (He) gas.

The collecting line 23 is used for supplying the liquid materials during a film formation process, and thus can be also called a liquid material supply line 23. The liquid material supply line 23 is connected to the vaporizer 200 through a cooling block 40. The cooling block 40 is configured to selectively cool each of the liquid materials to a temperature lower than the boiling temperature of its solvent, such as 10° C., when the liquid material is supplied into the nozzle 50. A carrier gas supply line 26 (carrier gas passage) is disposed to extend also through the cooling block 40. The carrier gas supply line 26 is connected to a carrier gas supply section 60 and is provided with a flow rate regulator M4 and a valve V13. The vaporizer 200 comprises a container 201 forming a vaporizing chamber, and a nozzle 50 airtightly attached to the opening at the top of the container 201.

The liquid material supply line 23 and carrier gas supply line 26 are connected to the nozzle 50. The nozzle 50 is of a spray-type having a double tube structure formed of inner and outer tubes. The inner tube discharges a liquid material supplied from the liquid material supply line 23, while the outer tube discharges nitrogen gas (or another inactive gas, such as Ar or He) used as an atomizing gas supplied from the carrier gas supply line 26. Each of the liquid materials is delivered in an atomized state (as mist) into the container 201 from a spray port 50a (having a hole diameter of, e.g., 0.25 mm) at the distal end of the nozzle 50.

The container 201 has an output port 202 formed in the sidewall at a lower position to output a process gas that is vaporized part of the liquid material. The container 201 further has a drain port 203 formed in the bottom to discharge non-vaporized part of the liquid material. The container 201 includes heaters 204 embedded in the wall and formed of, e.g., resistive heating bodies for heating the interior of the vaporizing chamber. The container 201 further includes a lower heat-exchange block 205 disposed on the bottom, which is formed of a cylindrical block and provided with heaters embedded therein.

The output port 202 is airtightly connected to the process gas supply line (gas supply passage) 30. The drain port 203 is connected to an exhaust pump 80 through a mist discharge line 27 provided with a valve V14. A temperature detector 206 and a pressure detector 70 are disposed to respectively detect the temperature and pressure inside the container 201 (vaporizing chamber) of the vaporizer 200. A power supply 207 is connected to the heaters 204 and lower heat-exchange block 205 and its supply power is controlled by a control section 90 described later with reference to the detection signal from the temperature detector 206.

The process gas supply line 30 is provided with a valve V15 and a regulator valve (serving as pressure adjusting means) VT1. The regulator valve VT1 is used for adjusting the flow rate of the process gas supplied through the process gas supply line 30. The regulator valve VT1 is controlled by the control section 90 comprising, e.g., a computer disposed in the gas supply apparatus 20. The process gas supply line 30 is connected to the exhaust pump 80 through an exhaust line 28 provided with a valve V16.

The film formation system 1 further includes a main control section 92 formed of, e.g., a computer to control the entire system. The main control section 92 can control a film formation process as described below in accordance with process recipes stored in the storage section thereof in advance, with reference to the film thickness and composition of a film to be formed. In the storage section, the relationship between the process gas flow rates and the thickness and composition of the film is also stored as control data in advance. Accordingly, the main control section 92 can control the respective components of the film formation processing apparatus 10 and gas supply apparatus 20, based on the stored process recipes and control data. Examples of a storage medium are a magnetic disk (flexible disk, hard disk (a representative of which is a hard disk included in the storage section), etc.), an optical disk (CD, DVD, etc.), a magneto-optical disk (MO, etc.), and a semiconductor memory.

Figure 3:
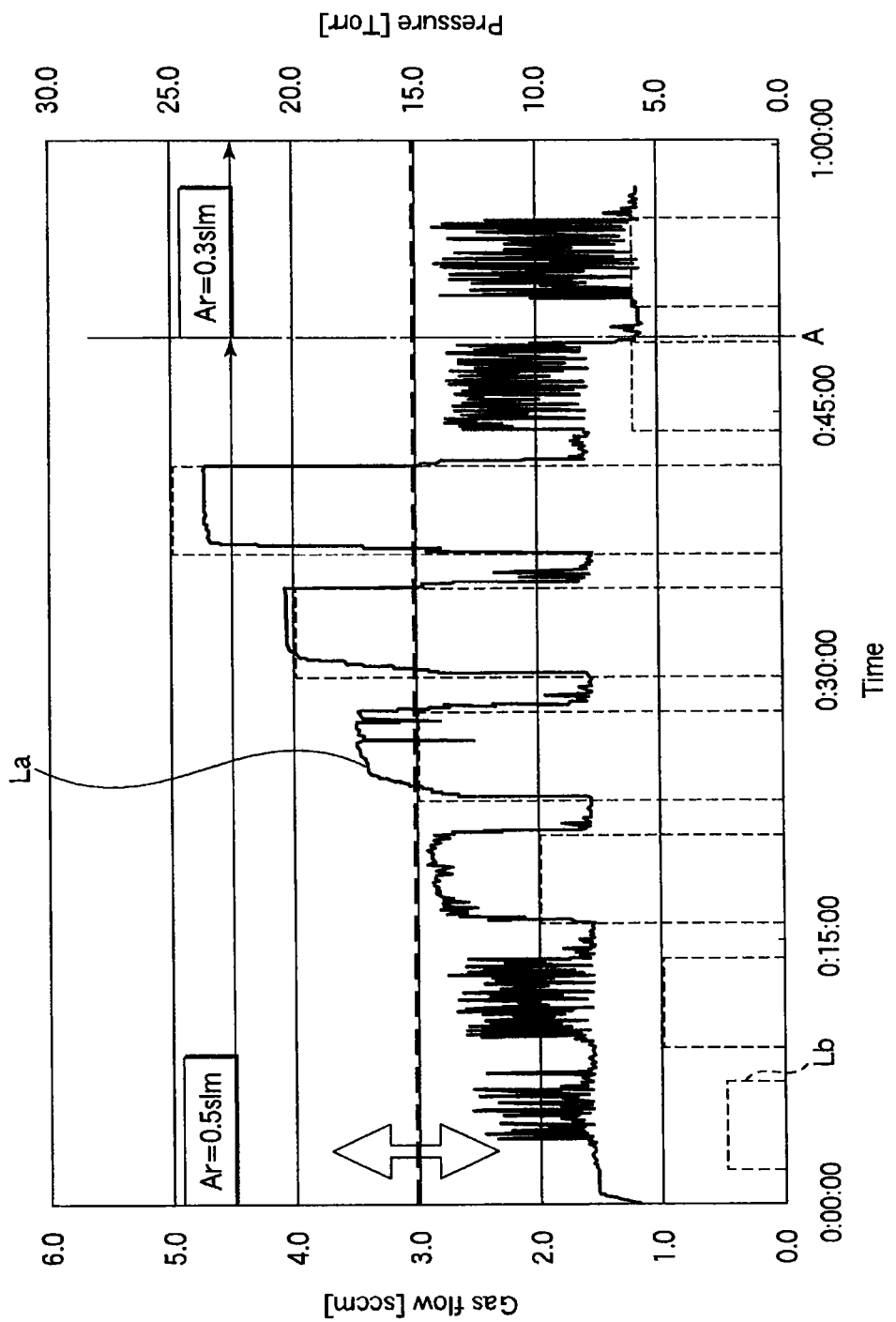
FIG. 3 is a view showing changes of the pressure inside the vaporizing chamber of the vaporizer shown in FIG. 2.

Next, an explanation will be give of a manner of adjusting the pressure inside the container 201 by the regulator valve (serving as pressure adjusting means) VT1. FIG. 3 is a view for explaining an operation and effect of the regulator valve VT1. Specifically, while argon (Ar) gas was supplied as a carrier gas at 0.5 slm or 0.3 slm, a liquid material prepared by dissolving $Sr(THD)_2$ in THF solvent was supplied at different values of the flow rate. During this process, the pressure inside the vaporizing chamber of the vaporizer was measured to examine the change of the pressure. In FIG. 3, the line La denotes the pressure inside the vaporizing chamber and the broken line Lb denotes the set flow rate of the liquid material.

In vaporizers of the same kind as this embodiment, the pressure inside the vaporizing chamber needs to be lower than an upper limit corresponding to a pressure for vaporizing a liquid material. Accordingly, this measurement was performed in light of this fact. As shown in FIG. 3, while argon gas was supplied at 0.5 slm, the flow rate of the liquid material was set at around 1.0 sccm, as shown by the broken line Lb. In this case, the pressure inside the vaporizing chamber became unstable, as seen in the strenuous pulsating movement of the line La. Then, while argon gas was supplied at 0.5 slm, the flow rate of the liquid material was set at 3.0 sccm or more, as shown by the broken line Lb. In this case, the pressure inside the vaporizing chamber became stable, as seen in the almost flat state of the line La. After the elapse of almost 50 seconds from the start of measurement, as indicated by the chain line A in FIG. 3, the flow rate of argon gas was decreased to 0.3 slm, and the liquid material was supplied at about 1.0 sccm. In this case, the pressure inside the vaporizing chamber became unstable, as seen in the strenuous pulsating movement of the line La. This pulsating movement was more active as compared to the case where argon gas was supplied at 0.5 slm and the liquid material was supplied at about 0.5 sccm.

Specifically, in vaporizers of the same kind as this embodiment, when the pressure inside the vaporizing chamber is lowered due to a decrease in the flow rate of a liquid material or carrier gas supplied into the vaporizing chamber, the pressure inside the vaporizing chamber becomes unstable with violent fluctuations. If the pressure inside the vaporizing chamber becomes unstable, the solvent of the liquid material is boiled in the tip of the nozzle and causes nozzle clogging and/or spray abnormality, as described previously. In light of this, the film formation system 1 according to this embodiment is arranged such that the pressure inside the vaporizing chamber is monitored to detect a decrease in the pressure by the pressure detector 70. Then, the pressure inside the vaporizing chamber is adjusted by the regulator valve VT1 to prevent the pressure from becoming unstable with violent fluctuations. For example, a predetermined pressure range may be written in a process recipe, and read out when the process recipe is selected by the main control section 92.

After the pressure is increased by the regulator valve VT1 in response to a decrease in the pressure inside the vaporizing chamber to the lower limit of the predetermined pressure range, the pressure needs not to exceed the upper limit of the predetermined pressure range preset in light of the pressure limit value for vaporizing the liquid material. For example, in the case of FIG. 3, the pressure inside the vaporizing chamber may be provided with a predetermined pressure range defined by an upper limit at about 4 kPa (30 Torr), which is lower than the pressure limit value for vaporizing the liquid material, and a lower limit at about 2 kPa (15 Torr), which is higher than the pressure limit value where the inner pressure starts causing violent fluctuations.

For example, the control section 90 reads out a predetermined pressure range from a selected recipe, and compares the pressure detection value obtained by the pressure detector 70 with the predetermined pressure range during the film formation. When the pressure inside the vaporizing chamber is lowered to the lower limit of the predetermined pressure range, the opening degree of the regulator valve VT1 is set smaller to decrease the flow rate of the process gas supplied through the process gas supply line 30. Thus, while the flow rates of the liquid material and carrier gas supplied into the vaporizing chamber are unchanged, the flow rate of the process gas flowing out of the vaporizing chamber is decreased. Consequently, the process gas prolongs its staying time and is more retained inside vaporizing chamber to increase the pressure inside the vaporizing chamber. When the pressure inside the vaporizing chamber is raised to the upper limit of the predetermined pressure range after the flow rate of the process gas is thus decreased, the opening degree of the regulator valve VT1 is set larger by a predetermined amount. Consequently, the process gas decreases its staying amount inside vaporizing chamber to decrease the pressure inside the vaporizing chamber, so as not to exceed the pressure limit value for vaporizing the liquid material.

As described above, according to this embodiment, the pressure inside the vaporizing chamber is controlled as follows. Specifically, for a predetermined liquid material, a first limit value is obtained at which vaporization of the liquid material starts being inhibited due to an increase in the pressure inside the vaporizing chamber. The first limit value may be obtained from experimental data or document data. Further, a second limit value is obtained at which vaporization of the liquid material starts being unstable and the pressure inside the vaporizing chamber starts pulsating movement (oscillation known as hunting) due to a decrease in the pressure inside the vaporizing chamber. The second limit value is preferably obtained from experimental data. Then, a predetermined pressure range is determined such that it is defined by an upper limit lower than the first limit value and a lower limit higher than the second limit value.

As described above, the lower limit of the predetermined pressure range is conceived to prevent the solvent of the liquid material from being boiled in the tip of the nozzle thereby causing nozzle clogging and/or spray abnormality. Thus, in other words, the second limit value can be said to be a pressure at which the solvent of the liquid material stars being boiled in the tip of the nozzle due to a decease in the pressure. In this embodiment, the liquid material is cooled to a predetermined temperature by the cooling block 40 immediately before the nozzle 50, and so the lower limit of the predetermined pressure range can be preset with reference to the pressure at which the solvent of the liquid material stars being boiled at the predetermined temperature.

The predetermined pressure range is preferably set to be wider, as long as the supply of the process gas is adversely affected. In this respect, studies were made in relation to liquid materials for forming high-dielectric constant thin film, prepared by dissolving various solid source materials in various solvents. As a result common to such liquid materials, it has been found that presetting the lower limit to be 40% to 60% of the upper limit provides a pressure range that can reliably prevent the hunting while realizing an efficient vaporizing process.

Then, the predetermined pressure range is stored as, e.g., part of a process recipe in a storage portion from which the main control section 92 reads out data. Thereafter, when the process gas is supplied to perform a film formation process in the film formation processing apparatus 10, the control section 90 is used to control an operation of the pressure adjusting mechanism (utilizing the regulator valve VT1 in the first embodiment) with reference to the pressure detection value of the pressure detector 70 to cause the pressure inside the vaporizing chamber to fall within the predetermined pressure range.

Next, an explanation will be given of a film formation method performed in the film formation system 1 according to this embodiment. At first, in the film formation processing apparatus 10, a predetermined number of wafers W are placed on the wafer boat 12 and are loaded into the reaction tube 11. Then, the interior of the reaction tube 11 is stabilized at a predetermined temperature and a predetermined pressure. Then, the process gas is supplied into the film formation processing apparatus 10. Specifically, at first, helium (He) used as a pressurized gas is supplied from the pressurized gas supply source (not shown) into the first storage vessel 21a, and a liquid material is supplied through the liquid material supply line 23 and cooling block 40 while the flow rate of the liquid material is adjusted by the flow rate regulator M1. The liquid material is cooled by the cooling block 40 and is then supplied into the nozzle 50. Further, a carrier gas, such as argon (Ar) gas, is supplied from the carrier gas supply section 60 through the cooling block 40 into the nozzle 50. Consequently, the liquid material set at a flow rate of, e.g., 5 sccm is sprayed as mist from the nozzle 50 into the vaporizing chamber.

The interior of the vaporizing chamber is heated by the heaters 204 and lower heat-exchange block 205 at, e.g., 150° C. The liquid material supplied as mist from the nozzle 50 is uniformly atomized and flows through the vaporizing space defined by the lower heat-exchange block 205 and container 201. Consequently, the liquid material is vaporized by heat exchange inside the container 201 into the process gas, which then flows out through the output port 202 into the process gas supply line 30.

On the other hand, mist mixed within the process gas does not change direction, but flows downward due to an inertia force based on its own large weight. Consequently, the mist is separated from the process gas and reaches the bottom of the container 201. The mist is accumulated and agglomerated to change into a liquid phase and is then solidified at the bottom of the container 201. The solidified by-product thus trapped at the bottom of the container 201 is treated in a certain maintenance cycle such that the temperature of the vaporizer 200 is decreased and a solvent is supplied into the container 201 to dissolve the by-product and discharge it from the drain port 203. Since the drain port 203 is formed at a position lower than the output port 202, no drainage liquid flows into the output port 202.

In this way, the process gas is supplied from the vaporizer 200 through the process gas supply line 30 into the film formation processing apparatus 10. The reaction tube 11 is further connected to an ozone gas supply unit (not shown). In the film formation process, Sr vapor is first supplied from the vaporizer 200, so that Sr gas molecules are adsorbed on the wafers. Then, supply of the Sr liquid material is stopped, and a purge step of the vaporizer 200 is performed by use of an inactive gas. At this time, the reaction tube 11 of the film formation section 10 may be vacuum-exhausted. Then, $O_3$ (ozone) is supplied from the ozone gas supply unit, so that Sr gas molecules on the wafers W are oxidized and thereby form an SrO molecular layer. Then, supply connection to the vaporizer 200 is switched from the first storage vessel 21a to the second storage vessel 21b, and Ti vapor is supplied from the vaporizer 200, so that Ti gas molecules are adsorbed on the wafers. Then, supply of the Ti liquid material is stopped, and a purge step of the vaporizer 200 is performed by use of an inactive gas. Then, $O_3$ (ozone) is supplied from the ozone gas supply unit, so that Ti gas molecules on the wafers W are oxidized and thereby form a TiO molecular layer. With this ALD process repeating the steps described above, SrO molecular layers and TiO molecular layers are laminated to form an STO (strontium titanate) film with a predetermined thickness. The composition ratio of the STO film may be controlled within a range of, e.g., SrO:TiO=3:11 to 5:9 by adjusting the number of film formation cycles for SrO and TiO.

During the film formation process, the pressure inside the vaporizing chamber is monitored by the pressure detector 70. When the pressure detection value is lowered to the lower limit of the predetermined pressure range, the opening degree of the regulator valve VT1 is set smaller than the initial value by the control section 90 to raise the pressure inside the vaporizing chamber. On the other hand, when the pressure detection value is raised to the upper limit of the predetermined pressure range, the opening degree of the regulator valve VT1 is set larger by the control section 90 with a predetermined amount, such as an amount to reach or not to reach the initial value. Consequently, even if the pressure inside the vaporizing chamber is lowered during the film formation process, the pressure is caused to fall within a pressure range for stably vaporizing the liquid material, and so the film formation process can be stably kept performed.

After the film formation process is performed, the interior of the vaporizer 200 and process gas supply line 30 is purged by use of a gas, such as nitrogen gas, to completely remove the liquid materials left inside the vaporizer 200. Further, a cleaning process may be periodically performed inside the vaporizer 200 and supply lines. Specifically, the solvent stored in the third storage vessel 21c is supplied through the solvent supply line 22c and connection line 24 into the first source material supply line 22a and second source material supply line 22b. Further, the solvent is supplied through the liquid materials supply line 23 and nozzle 50 into the vaporizer 200. Consequently, liquid-phase substances and solid-phase substances derived from the liquid materials and deposited inside the supply lines and container 201 are dissolved and washed out by the solvent. The solvent used for the cleaning is discharged out of the system through the drain port 203 and mist discharge line 27.

According to the first embodiment, the pressure inside the vaporizing chamber of the vaporizer 200 is monitored by the pressure detector 70. When the pressure detection value is lowered to the lower limit of the predetermined pressure range, the regulator valve VT1 on the process gas supply line 30 is adjusted to raise the pressure inside the container 201, so as to prevent vaporization of a liquid material from becoming unstable. Even where the flow rate of a liquid material is small, the film formation system 1 thus arranged can prevent the vaporizing efficiency from being deteriorated due to clogging in the tip of the nozzle 50 and/or spray abnormality, and also can prevent particle contamination from being caused due to an increase in residues. Consequently, vaporization of the liquid material can be stably performed, so that the film formation process is not interrupted but stably kept performed. As a method of adjusting the pressure inside the vaporizing chamber by the regulator valve VT1, a predetermined pressure range can be present in accordance with a process recipe between a lower pressure at which the pressure inside the vaporizing chamber becomes unstable and an upper pressure at which vaporization of the liquid material starts being inhibited, so that feedback control is performed to cause the pressure detection value to fall with the predetermined pressure range.

Second Embodiment

Figure 4:
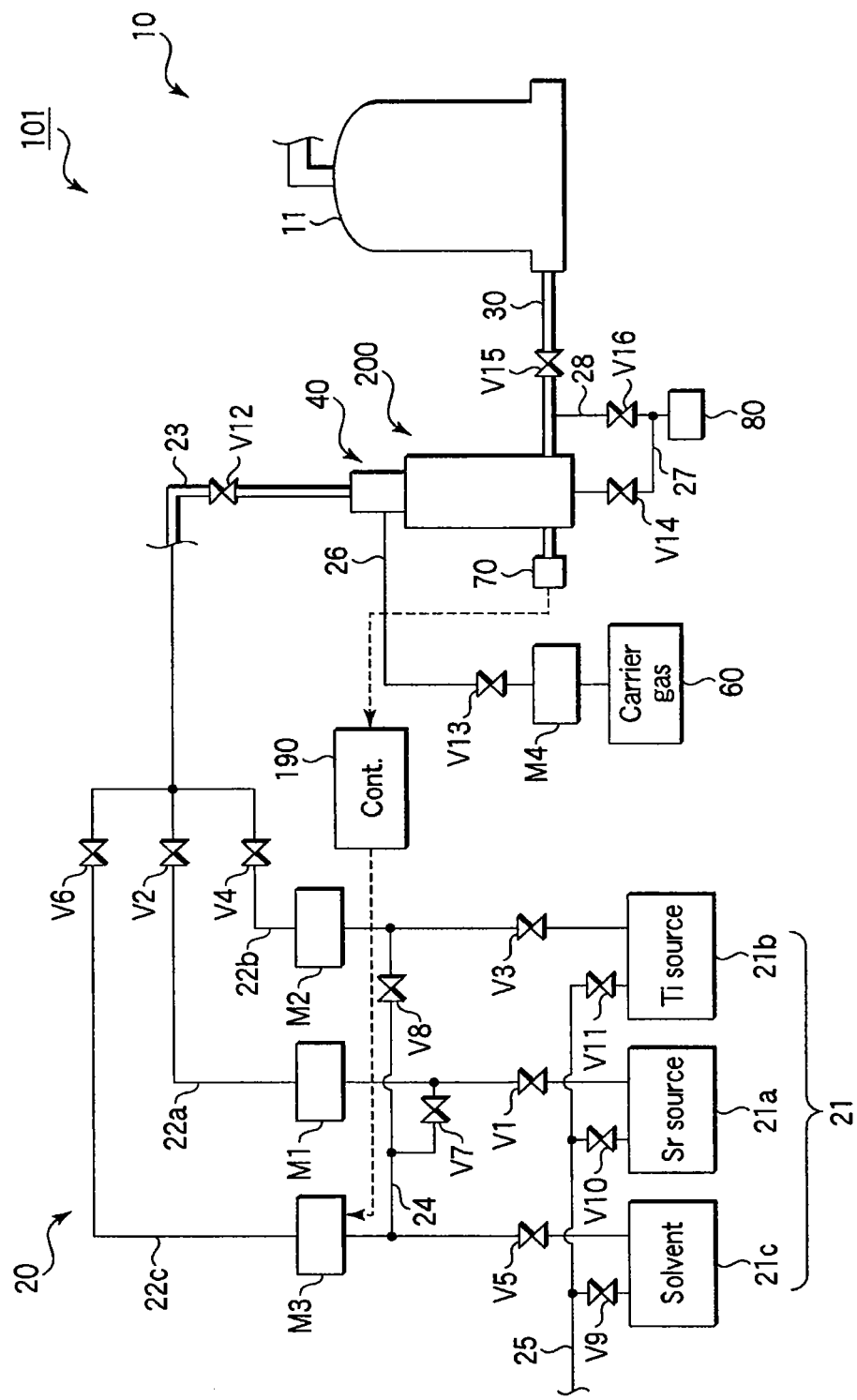
FIG. 4 is a structural view schematically showing a semiconductor processing system according to a second embodiment of the present invention.

FIG. 4 is a structural view schematically showing a semiconductor processing system according to a second embodiment of the present invention. The film formation system 101 according to the second embodiment is arranged to control the pressure inside the vaporizing chamber by adjusting the flow rate of the solvent supplied to the liquid material supply line 23 by use of the flow rate regulator (serving as pressure adjusting means) M3 disposed on the solvent supply line 22c. Accordingly, this arrangement is an alternative to the arrangement of the first embodiment which controls the pressure by use of the regulator valve VT1 disposed on the process gas supply line 30. When the film formation system 101 is normally performs a process, it operates in the same way as the film formation system 1 according to the first embodiment.

Specifically, when a film formation process is started, the opening degree of the flow rate regulator M3 is set at zero so as not to supply the solvent from the solvent supply line 22c to liquid material supply line 23. On the other hand, for example, a control section 190 reads out a predetermined pressure range from a selected recipe, and compares the pressure detection value obtained by the pressure detector 70 with the predetermined pressure range during the film formation. When the pressure inside the vaporizing chamber is lowered to the lower limit of the predetermined pressure range, the control section 190 controls the flow rate regulator M3 to start supplying the solvent into the vaporizing chamber while increasing the flow rate of the solvent. Thus, while the flow rate of the process gas flowing out of the vaporizing chamber is unchanged, the flow rate of the solvent supplied into the vaporizing chamber is increased. Consequently, the vaporized solvent prolongs its staying time and is more retained inside vaporizing chamber to increase the pressure inside the vaporizing chamber. When the pressure inside the vaporizing chamber is raised to the upper limit of the predetermined pressure range after the flow rate of the vaporized solvent is thus increased, the opening degree of the flow rate regulator M3 is set smaller by a predetermined amount, such that it is completely or not completely closed. In other words, an increase in the supply of the solvent is cancelled by the flow rate regulator M3. Consequently, the vaporized solvent decreases its staying amount inside vaporizing chamber to decrease the pressure inside the vaporizing chamber, so as not to exceed the pressure limit value for vaporizing the liquid material.

According to the second embodiment, when the pressure inside the vaporizing chamber is lowered to the lower limit of the predetermined pressure range, the flow rate regulator M3 on the solvent supply line 22c is adjusted to raise the pressure inside the container 201, so as to prevent vaporization of a liquid material from becoming unstable. Thus, the second embodiment can provide the same function and effect as those of the first embodiment.

Third Embodiment

Figure 5:
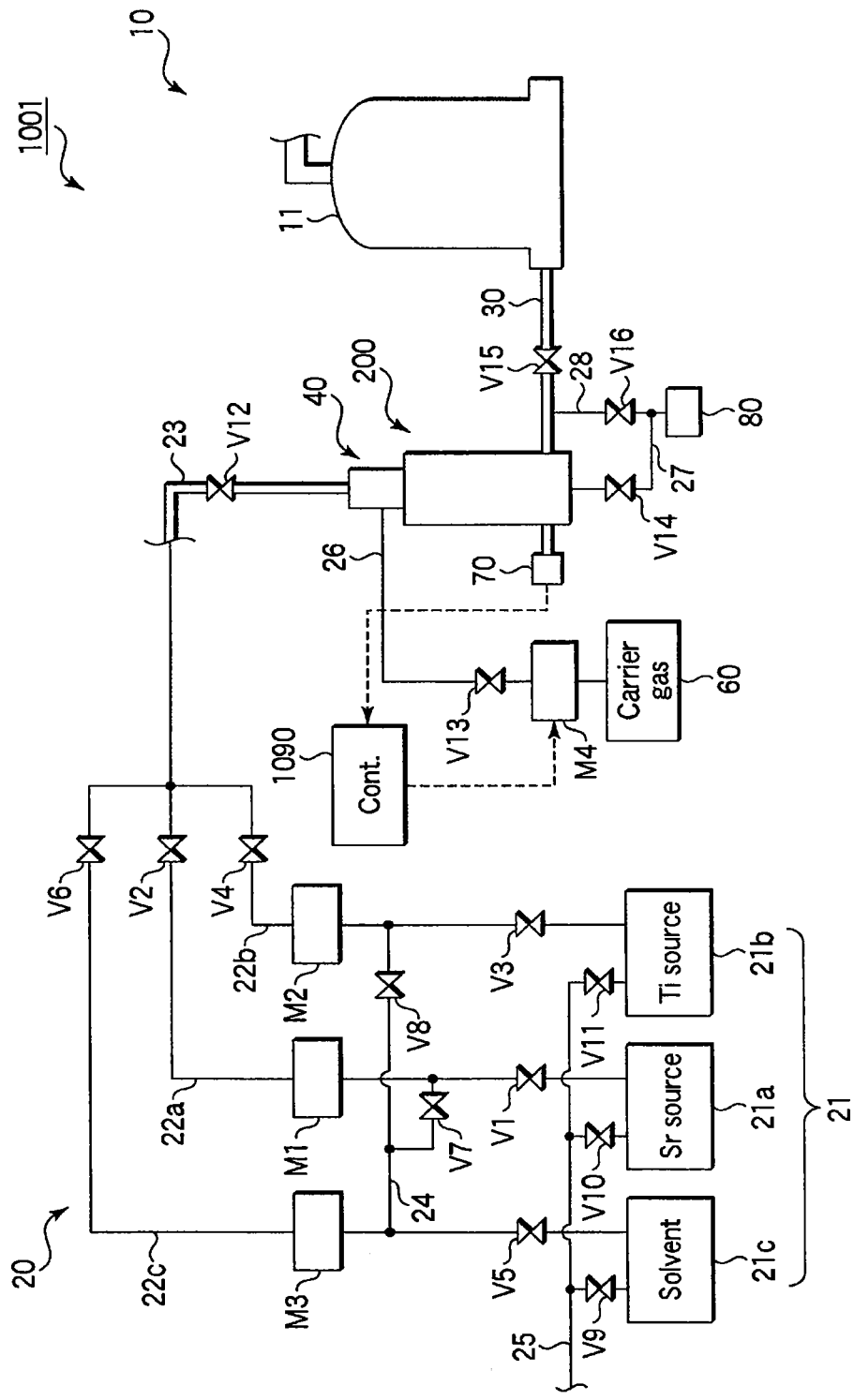
FIG. 5 is a structural view schematically showing a semiconductor processing system according to a third embodiment of the present invention.

FIG. 5 is a structural view schematically showing a semiconductor processing system according to a third embodiment of the present invention. The film formation system 1001 according to the third embodiment is arranged to control the pressure inside the vaporizing chamber by adjusting the flow rate of the carrier gas supplied into the vaporizing chamber by use of the flow rate regulator (serving as pressure adjusting means) M4 disposed on the carrier gas supply line 26. Accordingly, this arrangement is an alternative to the arrangement of the first embodiment which controls the pressure by use of the regulator valve VT1 disposed on the process gas supply line 30. When the film formation system 1001 is normally performs a process, it operates in the same way as the film formation system 1 according to the first embodiment.

Specifically, when a film formation process is started, the opening degree of the flow rate regulator M4 is set at 50%, so as to supply the carrier gas from the carrier gas supply line 26 at a small flow rate. On the other hand, for example, a control section 1090 reads out a predetermined pressure range from a selected recipe, and compares the pressure detection value obtained by the pressure detector 70 with the predetermined pressure range during the film formation. When the pressure inside the vaporizing chamber is lowered to the lower limit of the predetermined pressure range, the control section 1090 controls the flow rate regulator M4 to increase the flow rate of the carrier gas into the vaporizing chamber. Thus, while the flow rate of the process gas flowing out of the vaporizing chamber is unchanged, the flow rate of the carrier gas supplied into the vaporizing chamber is increased. Consequently, the carrier gas prolongs its staying time and is more retained inside vaporizing chamber to increase the pressure inside the vaporizing chamber. When the pressure inside the vaporizing chamber is raised to the upper limit of the predetermined pressure range after the flow rate of the carrier gas is thus increased, the opening degree of the flow rate regulator M4 is set smaller by a predetermined amount, such as an amount to reach or not to reach the initial value. In other words, an increase in the supply of the carrier gas is cancelled by the flow rate regulator M4. Consequently, the carrier gas decreases its staying amount inside vaporizing chamber to decrease the pressure inside the vaporizing chamber, so as not to exceed the pressure limit value for vaporizing the liquid material.

According to the third embodiment, when the pressure inside the vaporizing chamber is lowered to the lower limit of the predetermined pressure range, the flow rate regulator M4 on the carrier gas supply line 26 is adjusted to raise the pressure inside the container 201, so as to prevent vaporization of a liquid material from becoming unstable. Thus, the third embodiment can provide the same function and effect as those of the first embodiment.

<Consequence and Modification>

In the film formation system 1, 101, or 1001 according to each of the embodiments of the present invention, the regulator valve VT1 or flow rate regulator M3 or M4 is used to adjust the pressure inside the container 201. Under the control of the control section 90, 190, or 1090, when the pressure inside the container 201 is to go out of a predetermined pressure range for stably vaporizing a liquid material, flow rate control is performed by the regulator valve VT1 or flow rate regulator M3 or M4 to cause the pressure inside the container 201 to fall within the predetermined pressure range.

Consequently, the film formation system 1, 101, or 1001 according to each of the embodiments can prevent the pressure inside the container 201 from becoming too low without stopping the film formation process. Further, the system can prevent the vaporizing efficiency from being deteriorated due to clogging in the tip of the nozzle 50 and/or spray abnormality, and also can prevent particle contamination from being caused due to an increase in residues. Consequently, vaporization of the liquid material can be stably performed, so that the film formation process is not interrupted but stably kept performed.

In the film formation system 1, 101, or 1001, pressure data transmitted from the pressure detector 70 is used to judge whether abnormality of the pressure inside the container 201 is canceled. Alternatively, for example, cancellation of such abnormality can be judged by use of a preset value of a parameter used for adjusting the pressure inside the vaporizing chamber, such as the flow rate of the solvent or carrier gas. In this case, a preset value of a parameter corresponding to cancellation of abnormality is written in a table readable by the control section, and, when the pressure inside the vaporizing chamber becomes abnormal, the parameter, such as the flow rate of the solvent or carrier gas, is adjusted until the parameter reaches the preset value.

In the film formation system 1, 101, or 1001, the film formation is performed by an ALD process. Alternatively, film formation may be performed by use of a single liquid material in the process, or film formation may be performed by use of a process gas derived from a mixture of liquid materials.

In the film formation system 1, 101, or 1001, the opening degree of the regulator valve VT1 or flow rate regulator M3 or M4 is adjusted by one step by the control section. Alternatively, for example, the opening degree of the regulator valve or flow rate regulator may be gradually adjusted to gradually change the flow rate of the process gas, solvent, or carrier gas. In this case, a one-step change in the opening degree to be made in each step may be predetermined, so that the flow rate is adjusted in accordance with this one-step change. After the elapse of a certain time since the opening degree is adjusted, the pressure detection value is compared with the predetermined pressure range. If the pressure inside the vaporizing chamber is still out of the predetermined pressure range, the opening degree of the regulator valve or flow rate regulator is further adjusted with the one-step change to adjust the flow rate of the process gas, solvent, or carrier gas.

In the film formation system 1, the regulator valve VT1 may be maintained in a state where the flow rate of the process gas is decreased even after the pressure inside the container 201 is adjusted to fall within the predetermined pressure range. Alternatively, the regulator valve VT1 may be opened to return the flow rate of the process gas to the normal state after the pressure inside the container 201 is adjusted to fall within the predetermined pressure range.

In the film formation system 101 or 1001, the flow rate regulator M3 or M4 may be maintained in a state where the flow rate of the solvent or carrier gas is increased even after the pressure inside the container 201 is adjusted to fall within the predetermined pressure range. Alternatively, the flow rate regulator M3 or M4 may be retuned to the initial state to return the flow rate of the solvent or carrier gas to the normal state after the pressure inside the container 201 is adjusted to fall within the predetermined pressure range.

In the embodiments described above, the pressure detector 70 is connected to the vaporizer 200. Alternatively, the pressure detector may be connected to a portion of the process gas supply line 30 upstream from the valve V15, as long as it can detect the pressure inside the container 201.

In the embodiments described above, helium (He) gas is supplied as a the pressurized gas. Alternatively, for example, another inactive gas, such as nitrogen ($N_2$) gas or argon (Ar) gas, may be used in place of helium gas.

In the film formation system 1, 101, or 1001, the heaters 204 includes two heaters on the output port 202 side and two heaters on the other side opposite to the output port 202, wherein these heaters 204 are connected to the power supply 207. The number of heaters may be three or less or five or more, as long as they can uniformly heat the inner wall of the vaporizing chamber. Further, for example, heating of the heaters may be controlled by one temperature controller. Alternatively, the set of two heaters on the output port side and the set of two heaters on the opposite side may be controlled independently of each other. Alternatively, the four heaters may be controlled independently of each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation system for a semiconductor process, the film formation system including:
   a film formation apparatus for forming a high-dielectric constant thin film on target substrates together, the film formation apparatus including:
      a vertical process chamber configured to accommodate the target substrates,
      a support member configured to support the target substrates inside the process chamber,
      a heater configured to heat the target substrates inside the process chamber, and
      an exhaust mechanism configured to exhaust gas from inside the process chamber; and
   a gas supply apparatus for supplying a process gas into the film formation apparatus, the gas supply apparatus including:
      a container that forms a vaporizing chamber configured to vaporize a liquid material,
      a nozzle configured to atomize the liquid material by a carrier gas and to supply the liquid material into the vaporizing chamber,
      a liquid material supply passage configured to supply as the liquid material a material containing a solid material dissolved in a solvent to the nozzle, the solid material providing a component of the high-dielectric constant thin film,
   a cooling portion disposed on the liquid material supply passage immediately before the nozzle and configured to cool the liquid material to a set temperature lower than a boiling temperature of the solvent,
   a carrier gas supply passage configured to supply the carrier gas to the nozzle,
   a heater configured to heat an interior of the vaporizing chamber to vaporize the liquid material thus atomized and thereby to generate the process gas,
   a gas supply passage configured to supply the process gas from the vaporizing chamber to the process chamber,
   a pressure detector configured to detect pressure inside the vaporizing chamber; and
   a pressure adjusting mechanism configured to adjust the pressure inside the vaporizing chamber, wherein the method comprising:
   a preparatory stage of determining a set pressure range of pressure inside the vaporizing chamber for the liquid material cooled at the set temperature, the set pressure range being used for generating the process gas by the gas supply apparatus; and
   a film formation stage of performing a film formation process by the film formation system, thereafter, wherein the preparatory stage includes:
   obtaining a first limit value of pressure at which vaporization of the liquid material starts being inhibited due to an increase in the pressure inside the vaporizing chamber,
   obtaining a second limit value at which vaporization of the liquid material starts being unstable and the pressure inside the vaporizing chamber starts pulsating movement due to a decrease in the pressure, and
   determining the set pressure range to be defined by an upper limit lower than the first limit value and a lower limit higher than the second limit value, said determining the set pressure range being made such that the lower limit is 40% to 60% of the upper limit, wherein the film formation stage includes:
      generating the process gas by the gas supply apparatus and supplying the process gas into the process chamber of the film formation apparatus, and forming the high-dielectric constant thin film on product substrates inside the process chamber by depositing a material derived from the process gas, and wherein said generating the process gas in the film formation stage includes delivering the liquid material from the nozzle into the vaporizing chamber while controlling an operation of the pressure adjusting mechanism to cause the pressure inside the vaporizing chamber to fall within the set pressure range with reference to pressure detection values obtained by the pressure detector.

2. The method according to claim 1, wherein said determining the set pressure range in the preparatory stage is made such that the lower limit is higher than a pressure limit value at which the solvent starts being boiled in a tip of the nozzle due to a decrease in the pressure.

3. The method according to claim 1, wherein the pressure adjusting mechanism includes a flow rate regulator disposed on the gas supply passage and configured to adjust a flow rate of the process gas, and the film formation stage includes controlling an operation of the flow rate regulator to cause the pressure inside the vaporizing chamber to fall within the set pressure range with reference to the pressure detection values.

4. The method according to claim 1, wherein the gas supply apparatus further includes a solvent supply passage connected to the liquid material supply passage and configured to add a solvent to the liquid material, the pressure adjusting mechanism includes a flow rate regulator disposed on the solvent supply passage and configured to adjust a flow rate of the solvent, and the film formation stage includes controlling an operation of the flow rate regulator to cause the pressure inside the vaporizing chamber to fall within the set pressure range with reference to the pressure detection values value.

5. The method according to claim 1, wherein the pressure adjusting mechanism includes a flow rate regulator disposed on the carrier gas supply passage and configured to adjust a flow rate of the carrier gas, and the film formation stage includes controlling an operation of the flow rate regulator to cause the pressure inside the vaporizing chamber to fall within the set pressure range with reference to the pressure detection values.

6. The method according to claim 1, wherein the nozzle has a double tube structure formed of inner and outer tubes and configured to supply the liquid material from the inner tube and to supply the carrier gas from the outer tube.

7. The method according to claim 1, wherein the film formation stage includes alternately delivering first and second liquid materials, which respectively contain first and second solid materials providing different components of the high dielectric constant thin film and dissolved in the solvent, into the vaporizing chamber through the liquid material supply passage and the nozzle, while controlling an operation of the pressure adjusting mechanism to cause the pressure inside the vaporizing chamber to fall within set pressure ranges respectively corresponding to the first and second liquid materials with reference to pressure detection values obtained by the pressure detector.

8. The method according to claim 7, wherein the film formation stage includes supplying the solvent to the first and second liquid materials by a solvent supply passage connected to the liquid material supply passage at a position common to the first and second liquid materials, and controlling an operation of a flow rate regulator of the solvent, serving as the pressure adjusting mechanism, to cause the pressure inside the vaporizing chamber to fall within set pressure ranges respectively corresponding to the first and second liquid materials with reference to pressure detection values obtained by the pressure detector.

9. The system according to claim 7, wherein the first and second solid materials are $Sr(THD)_2$ and $Ti(MPD)(THD)_2$, respectively, and the high-dielectric constant thin film is a strontium titanate film.

* * * * *